United States Patent [19]

Fournel et al.

[11] Patent Number: 6,006,346

[45] Date of Patent: Dec. 21, 1999

[54] METHOD AND EQUIPMENT FOR AUTOMATICALLY TESTING ELECTRONIC COMPONENTS

[75] Inventors: Jean-Claude Fournel, Saint-Victor-Malescours; Thierry Devun, Saint-Bonnet-les-Oules; Jean-Pierre Dumas, Saint-Etiene, all of France

[73] Assignee: Schlumberger Industries, Montrouge, France

[21] Appl. No.: 08/849,290

[22] PCT Filed: Dec. 20, 1995

[86] PCT No.: PCT/FR95/01704

§ 371 Date: May 14, 1997

§ 102(e) Date: May 14, 1997

[87] PCT Pub. No.: WO96/20444

PCT Pub. Date: Jul. 4, 1996

[51] Int. Cl.[6] .................................................. G01R 31/28
[52] U.S. Cl. .............................................................. 714/724
[58] Field of Search ................................ 714/724, 2, 25, 714/37, 39, 42, 44, 706

[56] References Cited

U.S. PATENT DOCUMENTS 5,025,205   6/1991   Mydill et al. ........................... 324/73.1

OTHER PUBLICATIONS

Douglas Mirizzi et al, "Implementation of Parallelsite Test on an 8–Bit Configurable Microcontroller", Proceedings International Test Conference, pp. 227–235, Jan. 1993.

"How Genrad's New Tester Copes with VHSIC Chips", Electronics, vol. 59, May 1986, New York US, pp. 49–52.

Kiyosato, "Testing Method of Large Scale Integrated Circuit", Patent Abstracts of Japan, vol. 007, No. 241, p. 232, Oct. 1983.

Kiyosato, "LSI Tester", Patent Abstracts of Japan, vol. 008, No. 129, p. 280, Jun. 1984.

*Primary Examiner*—Hoa T. Nguyen
*Attorney, Agent, or Firm*—Frishauf, Holtz, Goodman, Langer & Chick, P.C.

[57] ABSTRACT

Method and apparatus of testing electronic components in parallel employs instructions which are contained in a memory. The instructions include information relating to test to be performed on a plurality of components to be tested in parallel after the components have been matched using a matching sequence. The method makes it possible to eliminate the matching sequence for matching a component after its matching sequence has not succeeded after a predetermined time period, while allowing the other components to be matched.

11 Claims, 1 Drawing Sheet

METHOD AND EQUIPMENT FOR AUTOMATICALLY TESTING ELECTRONIC COMPONENTS

FIELD OF THE INVENTION

The present invention relates to methods and equipment for automatically testing electronic components containing sequential digital portions, and more particularly to test equipment which makes it possible to test a plurality of such components in parallel.

BACKGROUND INFORMATION

Most digital circuits on the market are tested by their manufacturers several times before they are delivered. Component testers are assigned to generate digital signals (logic "0" or "1" states) and to verify the presence of transitions at the output of the circuit under test. The signals generated and the comparison signals are programmable both in time and in level. A component tester must generate and/or compare signals on all of the function pins of the component under test simultaneously.

Defining the signals to be generated and/or to be compared is generally extremely complex. Testing a microprocessor can give rise to strings of several million zeros and ones in the same sequence. To define such signals, the notion of period is used to define a time slice within which a more simple signal is described. Such a signal is subdivided into an item of time information (also referred to as a "time marker") and an event (e.g. a transition or a test).

Executing a functional test thus results in a memory running in which each line corresponds to a period and whose content represents the time information and the events defining the signal within the period for each pin. In addition to the time information and the events, there is an instruction serving to manage the running of the memory. The instruction is common to all of the function pins of the circuit under test. The most commonly used instruction is the instruction consisting in going to read the following line (INC instruction). This memory is referred to as the "main" memory. "Sub-program" memories are also used.

This architecture, based on running the memories, is deterministic, i.e. the architecture assumes that it is possible, a priori, to know exactly what is going to happen at a given instant on the output pins of the circuit under test.

Digital components (e.g. microprocessors) exist in which the internal logic state cannot be known a priori. Therefore, the test signals cannot be known a priori. To test this type of component, it must be possible to bring the component into a known state. For this purpose, it must be possible to generate signals (e.g. clock signals) until a predetermined event or succession of events appears on one or more outputs of the circuit under test. To manage the running of the main memory or of the sub-program memory under such conditions, suitable instructions exist that consist in looping the memory so long as a particular condition has not occurred. The method which consists of waiting for a circuit to put itself in a predetermined state is called "matching". The simplest example is to consider a divider whose initial state is not known. Clock signals generated at the input of the divider cause a transition to occur once every n clock edges. To synchronize this type of component, it is necessary to generate clock signals until an output transition appears. Once such a transition appears, the divider is in a known state, and the remainder of the test is performed in deterministic manner. If the component under test is bad, the exit condition from the matching sequence might never be found. A maximum number of loops must be initially programmed to avoid looping indefinitely. For example, for a divider by n, the output transition must be found in less than n+1 clock edges. In which case, after n+1 edges, the matching sequence stops and the divider is deemed to be bad. In certain complex cases, the time necessary for deeming a matching sequence to be bad can be quite long.

The architecture of a tester contains a portion for generating/receiving digital signals and a portion for shaping said signals. Usually, the shaping portion constitutes the measurement head whereas the generate/receive portion can be situated in a separate bay.

To optimize the cost of the test, it is possible to connect a plurality of heads to the portion for generating/receiving signals. Generally, multiplexers (1 per signal and per pin) placed at the output of the generate/receive portion make it possible to switch the signals to one head or to the other. Thus, a component is tested on head No. 1 while another component is being connected to head No. 2, and vice versa. This makes it possible to increase the capacity of the tester by adding a head. Typically, if the test time is identical to the connection time, adding a head makes it possible to double the capacity of the tester. The circuits tested on the two heads must be identical.

Since identical signals are generated on both heads, and since the comparison signals must also be similar, it was decided to propose testers having two heads for simultaneous operation. The generated signals are sent in parallel to both heads. The received signals are compared with a table simultaneously by different circuits. The tester then handles two results: the result coming from head 1 and the result coming from head 2. Thus, merely by duplicating the circuit for comparing the received signals with a table (given that the table is the same for head 1 and for head 2 since the generated signals and the components to be tested are identical), the capacity of the tester is genuinely doubled.

Testing in parallel makes it possible to test n components simultaneously in a manner similar to testing a single component. The entire set of resources serving to test a component is referred to as a "site". Simultaneous testing may be performed on the same head or on a plurality of heads. The present invention addresses both of these cases.

When a plurality of components are tested in parallel, matching involves bringing all of the components into a known and identical state. When the desired condition appears on a first one of the components, the other components can be in any state. It is thus necessary to synchronize the first component, and then to go on to the next component while maintaining the first component in a known state and so on.

Conventional component testers suffer from a serious drawback which is that when a defect is detected during a functional sequence, the sequence is stopped, and, generally the next component is then tested. An object of the present invention is to provide method and equipment for testing in parallel, in which method and equipment good components continue to be tested while matching of bad components is ignored, so as to avoid having to devote time, and possibly a long time, to trying to synchronize a bad component.

Furthermore, it must be possible for a test designed to operate on n components in parallel to be capable of operating on a smaller number of components. According to the present invention, the matching sequences for matching a bad component or an unused site are automatically ignored so as not to penalize the test time. For example, when testing a silicon wafer, when the spike card arrives at the end of the wafer, it is possible that the sites are outside the diffused zone, and that certain test needles are not in contact with any of the components. In which case, a tester of the present invention ignores the matching sequences for such components.

The matching sequences may be ignored a priori if the corresponding site is disabled, or if another test has already deemed the component to be bad.

The matching sequences may also be ignored in real time if one of them does not succeed.

SUMMARY OF THE INVENTION

More precisely, the present invention provides a method of testing electronic components in parallel by using instructions contained in a main memory, or in a sub-program memory, each instruction containing information relating to the test to be performed on the sites to be tested in parallel, after the components have been matched using a matching sequence for bringing each component into a known and identical state, said method being characterized by the following steps, making it possible to eliminate the matching sequences for matching a component when one of them has not succeeded, while allowing the other component(s) to be matched:

the address of the site under test is recorded in a counter;

enabling information on the basis of which the matching sequence for matching a site must be performed or ignored is contained in an enable memory addressed by said counter; and said enabling information is written prior to the test sequence so as to perform the matching sequence for matching the site in the event of enabling, or so as to ignore it by going on to the following instruction in the main memory.

Said enabling information may be modified in real time if a matching sequence is bad, so as to disable the future matching that might occur for the site in the same sequence.

Said memory is read back at the end of the sequence and it makes it possible to identify the matching sequences that have failed.

According to a characteristic of the method of the invention, said enable memory is programmed a priori and/or during testing.

The invention also provides test equipment for automatically testing electronic components provided with connection pins, in which equipment the components are tested in parallel by means of at least one test head, said equipment comprising:

a main memory, instructions to be executed for the test, and a table containing data to be compared with the data resulting from the tests;

elementary test circuits, each of which is assigned to a connection pin and is connected to the inputs and outputs of said test heads, the inputs of the elementary circuits being connected to the output of the main memory;

a matching circuit for comparing the test data with predetermined data so as to bring each component into a known and identical state using a matching sequence, the circuit being connected to the outputs of said elementary test circuits; said test equipment being characterized by the following, to make it possible to eliminate the matching sequences for matching a component when one of them has not succeeded, while allowing the other component(s) to be matched:

a counter which determines the sites to be matched, and which has an incrimination input connected to an output of said matching circuit; and an enable memory addressed by said counter and which defines whether each of said sites is to be matched or ignored.

The enable memory of the matching circuit includes an enable output which transforms the main memory management instruction so as to go to the next line (INC) if the matching sequence is to be ignored.

The test equipment advantageously includes a multiplexing circuit making it possible to program a priori the enable memory of the matching circuit or to program it in real time.

The invention will be better understood on reading the following description of an implementation of the invention given by way of non-limiting example and with reference to the accompanying drawing, in which the sole figure diagrammatically shows the test equipment portion of the invention.

BRIEF DESCRIPTION OF THE DRAWING

The FIGURE shows the apparatus for automatically testing electronic components according to the present invention.

Managing functional synchronization of components on a parallel tester of the invention involves a particular architecture making it possible to define a priori or in real time, the sites to be synchronized. This architecture includes a counter which defines the number of the site that is being synchronized, and an enable memory for enabling the matching circuit and that is programmable by bus (a priori programming) or in real time (at the end of a matching sequence) which enable memory is addressed by the above-mentioned counter, and indicates whether or not matching of the corresponding site is to be ignored. The implementation explained below includes parallel and simultaneous testing on two heads. The invention also applies to single-head test equipment used for testing a plurality of components in parallel.

Figure 1:
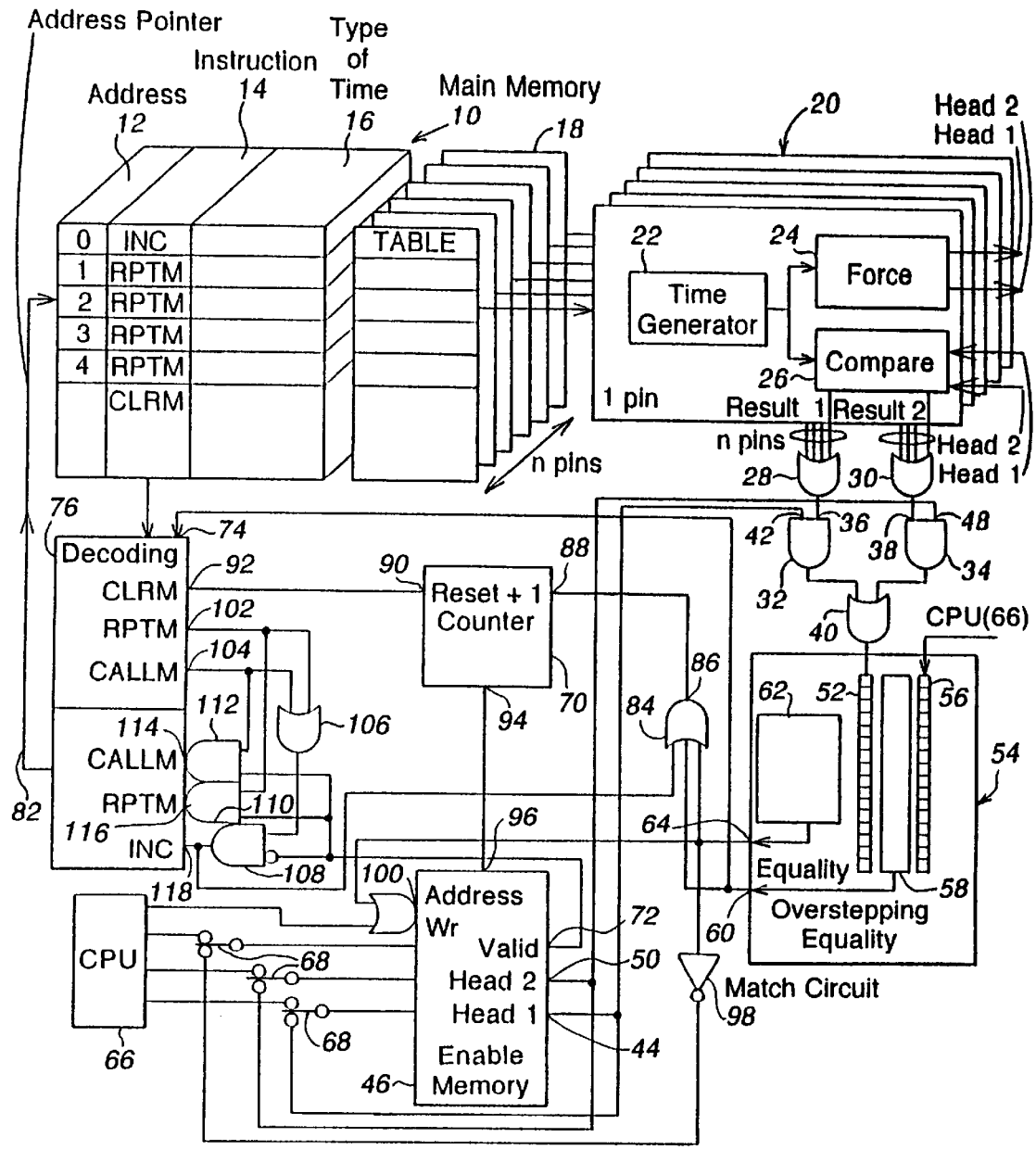

In the sole FIGURE, the main memory 10 contains the instructions necessary for running the functional test sequence.

The main memory is generally voluminous (several million elementary test operations referred to as "vectors"). For reasons of cost and of volume, slow memories are used in association with electronic circuitry enabling the vectors to be managed rapidly using a plurality of slow memories in parallel. The electronic circuitry does not make it possible to implement jumps (and therefore loops) inside the memory.

When testing a digital circuit requires that loops be used, or when certain sequence portions must be repeated several times inside the same functional test, a sub-program memory is used that is smaller in size but whose set of instructions is fuller. An instruction exists in the main memory making it possible to go to the sub-program memory. At the end of execution of a sub-program, the test returns to the main memory.

Each address 12 of the main memory defines inter alia:

An instruction 14 which is common to all of the pins under test, and which manages running of the main memory. The call instructions for calling the matching sequence are referred to as "call match" or "CALLM" and "repeat match" or "RPTM". When these instructions are invoked, the matching circuit is activated and it thus manages running of the main memory or of the sub-program memory. The RPTM instruction executes the same line until a match is found. The CALLM instruction executes a series of instructions until a match is found. The INC instruction consists simply in going to the next line.

The definition of the type of time 16 to be used during execution of the address of the memory. The type of time is common for all of the pins of the tester, and it corresponds to the address of a memory which is per pin and in which the values of the times corresponding to the address are defined. This time definition architecture corresponds to "sequencer per pin" architecture as disclosed in U.S. Pat. No. 5,212,443.

A table 18 which corresponds to the logic content (0 or 1) of the signals to be sent or to be compared. This table is per pin.

The tester receives from the component under test signals that it compares with the data in the table 18. A received signal can be tested or ignored. During a test period (the elementary time slice of a test sequence), each pin from which a signal is received is either ignored, or else it complies with the table or it does not comply with the table. The entire set of the non-ignored pins make it possible to define whether or not the table is complied with (logic "or" on all of the pins generating a tested signal). Then a succession of conditions (compliance or non-compliance) is defined. When this list of conditions is satisfied, a match is said to have been "found". Matching always includes a maximum number of periods beyond which a match is declared "not found". The matching operation is a means of bringing a component to a known state. It consists in executing a sequence of elementary operations until a series of events take place at the output of the circuit under test. When this sequence takes place, a match is said to have been "found". The component is then in a known state.

The main memory makes it possible to define the signal to be generated for each pin. Thus, a signal comparison or generation elementary function is defined that is identical for each pin, and that, on the basis of the information in the main memory 10, generates the stimuli and receives the signals to be compared.

This is achieved by means of identical elementary test circuits 20, each circuit being assigned to a pin, and comprising a time generator 22 controlling in parallel a forced event generator 24 sending test signals to the two heads 1 and 2 (e.g. a pin of the component is "forced" from 0 volts to 5 volts), and a comparison circuit 26 receiving test signals from the heads 1 and 2 and comparing them with the data contained in the table 18.

The time generator 22 defines the instants at which the signal edges must be generated, the instants at which comparison with the table 18 must be started, and the instants at which said comparison must be ended. When the comparison circuit 26 is to perform a comparison, it generates a result (that either complies or does not comply with the table). The result is specific to each pin and to each head on which the comparisons are performed. In the figure, the result is indicated by "result 1" for head 1, and by "result 2" for head 2. By effecting a logic "OR" on the entire set of the pins to be tested, by means of the OR gates 28 and 30, respectively for head 1 and for head 2, it is possible to find out whether or not said set complies with the table.

The outputs of the OR gates 28 and 30 are connected respectively to the inputs 36 and 38 of the AND gates 32 and 34. The outputs of the AND gates 32 and 34 are connected to respective ones of the two inputs of an OR gate 40. The second input 42 of the AND gate 32 is connected to the output 44 of a matching sequence enable memory 46. This output 44 corresponds to head number 1. Symmetrically, the second output 48 of the AND gate 34 is connected to the output 50 of the enable memory 46. This output 50 corresponds to head number 2.

The logic circuit defined by the two AND gates 32 & 34 and by the OR gate 40 makes it possible to define a signal which, at each test step (period), is equal to 0 or 1. The signal is equal to 0 when the test of the component complies with the table and when the corresponding head 1 or 2 is enabled by means of the enable memory 46. The output of the OR gate 40 is at the logic level 1 if the tested component does not comply with the table, and if the head 1 or 2 corresponding to the AND gates 32 or 34 is enabled. The outputs of the OR gates 28 and 30 are at a logic level 0 if the components tested by the heads 1 and 2 comply with the table. In contrast, if one of the components does not comply with the table, e.g. the component tested by means of head 1, the output of the OR gate 28 is at a logic level 1.

The signal output by the OR gate 40 is injected into a shift register 52 of a matching circuit 54. The shift register advances at each period. At each period, the content of the shift register 52 is compared with the content of a register 56 which has been pre-programmed by means of the processor (CPU) of the test equipment. This register 56 is initialized at the beginning of the test sequence. A digital comparator 58 generates a signal at a logic level 1 when the shift register 52 has the same content as the register 56 programmed by the processor (CPU) at the beginning of the sequence. The "match" output 60 of the matching circuit 54 is at logic level 0 when the contents of the registers 52 and 56 are not equivalent. A step counter 62 generates a signal of logic level 1 at the "timeout" output 64 when a match is not found after a predetermined number of periods (timeout signal).

The enable memory 46 of the matching circuit makes it possible to enable or not to enable a matching state on each of the heads 1 and 2 by means of the AND gates 32 & 34 and of the OR gate 40. This memory 46 may be programmed by a register (CPU) 66 of the test equipment (a priori programming) as a function of information that is already available on the component (site not used or component deemed to be bad in a previous test) or in real time, i.e. during the sequence, as a function of the position of the multiplexer 68. The addresses of the memory are determined by an address counter 70. The memory 46 includes 3 bits per address, namely one bit for defining whether or not the matching is enabled (bit 0), one bit for enabling or not enabling head 1 (bit 2), and one bit for enabling or not enabling head 2 (bit 1). The memory includes 256 lines. Its content is thus 256×3 bits, whereas the counter 70 is an 8-bit counter (8 bits being sufficient to define the 256 addresses of the enable memory). The 3 bits per addresses of the enable memory correspond to the three outputs 44, for head 1, 50, for head 2, and 72, for the "enable" output.

The "match" output 60 of the matching circuit is connected to the input 74 of the decoding circuit 76 for decoding the instructions for running of the memory (the main memory or the sub-program memory). This circuit interprets said instructions to manage the value of the address pointer 82 of the main memory, for example. When a matching sequence call instruction 14 is invoked, the decoding circuit 76 waits for a match to be found (output 60 of the matching circuit connected to the input 74 of the instruction decoding circuit) before it increments the address pointer of the main memory.

The "match" output 60 is also connected to one of the three inputs of an OR gate 84 whose output 86 is connected to the "+1" input 88 of the address counter 70. The "reset" input 90 of the address counter is connected to the CLRM output 92 of the decoding circuit 76. The output 94 of the counter 70 is connected to the "address" input 96 of the enable memory.

The "timeout" output 64 is connected to one of the inputs of the OR gate 84, to the input of the multiplexer 68 via an inverter 98, and to one of the two inputs of an OR gate 100. The other input of the gate 100 is connected to the register (CPU) 66. The output of the gate 100 is connected to the write input Wr of the enable memory 46.

When the decoding circuit 76 decodes a matching sequence call instruction, the signals (RPTM) at the output 102 or (CALLM) at the output 104 are activated. The logic gates 106, 108, 110, and 112 make it possible to transform or not to transform these instructions into the INC instruction. If the enable memory 46 has its enable output 72 at 1, the signals 114 (CALLM) and 116 (RPTM) are identical to the signals 104 (CALLM) and 102 (RPTM). As a result, the matching sequence is performed and the decoding circuit waits for a match (input 74) to be found before it increments the address pointer 82 of the main memory 10.

If the enable output 72 is equal to 0, the outputs of the AND gates 110 and 112 are at 0, and the output of the gate 108 is activated. In which case, it is the INC signal 118 which is equal to 1, and the decoding circuit takes into consideration the INC instruction instead of the matching sequence call instruction.

The head 1 output 44 and the head 2 output 50 of the enable memory 46 are used to select head 1 or head 2, or both heads for the matching operation performed in the matching circuit 54, by acting on the AND gates 32 and 34.

In simplified manner, the circuit operates as follows. The counter 70 is initialized at 0 at the beginning of the functional sequence. It determines the number of the site on which the matching is to be done. The counter addresses the memory which defines whether the site should be ignored (enable output =0) or taken into account (enable output =1), and on which head it is done (head 1 or head 2). Comparing a signal generated by a pin under test generates a result that is specific to each head (result 1, result 2). In most cases, matching is done on one head and then the other. In this way, the matching circuit takes into account one result at a time. In certain cases, to save time, it may be envisaged to execute the matching on both heads in parallel. In which case, the matching circuit receives a result which is a logic combination of the results of the two heads. It is then necessary to ensure that the running of the sequence makes it possible in all cases to synchronize both circuits in a single matching operation.

According to the invention, the CALLM and RPTM instructions are transformed into INC instructions when the matching of a site is to be ignored. If the enable output 72 of the memory is at 0 (ignore the site), the CALLM and RPTM instructions are transformed into INCs.

If a match is not found, the bit corresponding to the site is set to 0 so as to prevent the following matching operations on this component. At the end of the matching operation (regardless of whether or not a match is found), or if the site is inhibited, the address counter 70 advances by one step so as to point the memory to the following site. In the main memory 10 (or in the sub-program memory), there must be as many matching operation calls as there are sites (head 1 and head 2) (the inhibited sites having been disabled during filling of the memory). At the end of the matching operations, a CLRM ("clear match") instruction enables the address counter 70 to be reset.

Let us take the example of the sequence programmed in the main memory (INC, RPTM, RPTM, CLRM). Let us assume that the content of the enable memory 46 corresponds to the following table (bit 0 of the memory corresponding to the enable output 72, bit 1 corresponding to the head 2 output 50, bit 2 corresponding to the head 1 output 1, and Addr. corresponding to the address input 96):

| Addr. | Bit 2: Head 1 | Bit 1: Head 2 | Bit 0: Enable | |
|---|---|---|---|---|
| 0 | 1 | 0 | 1 | Matching enabled on head 1 (site 0) |
| 1 | 0 | 1 | 1 | Matching enabled on head 2 (site 1) |
| 2 | 1 | 0 | 0 | Matching inhibited (component deemed bad in a preceding test (site 3) |
| 3 | 0 | 1 | 1 | Matching enabled on head 2 (site 4) |

On starting the test sequence, it is assumed that the address counter 70 is at 0, the enable memory 46 is thus addressed at address 0.

1) INC: a signal period is generated as a function of the content of the main memory. The address counter 12 of the main memory 10 is incremented to point to the following line.

2) RPTM: the other instruction is executed on the site 0 because the memory is enabled. The events corresponding to this line of the main memory do not make any comparison on pins other than those of the site 0 so as not to disturb the result (result 1) which is used by the matching circuit 54. Assuming that a match is found, the address counter 70 is incremented so as to address the address 1 of the enable memory 46. Since a match has been found, the address counter 12 of the main memory is incremented.

3) RPTM: identical to 2) on the site 1.

4) RPTM: the enable memory 46 inhibits the site; the RPTM instruction is transformed into an INC instruction; no time has been lost on this component.

5) RPTM: identical to 2) and 3). Let us assume that a match has not been found. The "timeout" bit is activated by the matching circuit. This bit is written in the enable memory via the Wr input 100. Thus, bit 0 (enable output 72) of address 3 is equal to 0. The matches that could take place in this sequence would be inhibited (case 4) on this site.

6) CLRM: the address counter 70 is reset so as to start on site 0 if other matching sequences take place during the test.

The enable memory 46 may be read back after a functional test. By reading the memory back and by comparing it with its initial content, it is possible to identify the sites on which matching has failed.

We claim:

1. A method of testing electronic components in parallel by using instructions contained in a memory, each instruction containing information relating to a test to be performed on a plurality of components to be tested in parallel after the components have been matched using a matching sequence for bringing each component into a known and identical state, said method making it possible to eliminate the matching sequence for matching a component after its matching sequence has not succeeded after a predetermined period of time, while allowing the other component(s) to be matched, and comprising the steps of:

recording an address of the component under test in a counter;

storing enabling information on the basis of which the matching sequence for performing the matching sequence for matching one of said components must either be performed or ignored, said enabling information being stored in an enable memory addressed by said counter; and writing said enabling information into said enable memory prior to performing the matching sequence so that based thereon either matching the component will be performed, or matching will be ignored by going on to the following instruction in the main memory.

2. A method according to claim 1, wherein said enable memory is programmed a priori when the plurality of components not to be tested are known in advance.

3. A method according to claim 1, wherein said enable memory is programmed during testing when the matching sequence for matching a component has not succeeded, the subsequent matching sequences for this component thus being disabled.

4. A method according to claim 1, wherein the instructions contained in the main memory or in the sub-program memory are decoded and enabled or transformed by means of said enable memory so as respectively to perform or not to perform the matching sequence on the site defined by said counter.

5. Test equipment for automatically testing, in parallel by means of at least one test head, electronic components having connection pins, said test equipment comprising:

a main memory (10) for storing instructions (14) to be executed for the automatic test and a table (18) containing first predetermined data to be compared with test data resulting from the automatic test;

elementary test circuits (20) operatively coupled to the main memory, each of the elementary test circuits being coupled to a respective connection pin and to the inputs and outputs of said at least one test head, each of the elementary test circuits comparing test data generated at the respective connection pin to the first predetermined data and generating an output signal in response thereto;

a matching circuit (54) operatively coupled to outputs of the elementary test circuits, the matching circuit executing a matching sequence and comparing the elementary test circuit output signal with second predetermined data, so as to determine whether each component is in a known and identical state;

a counter (70) having an incrimination input (88) connected to an output (60) of said matching circuit, the counter identifying a component to be subjected to the matching sequence; and an enable memory (46) addressed by said counter (70) which defines whether or not each of said components is to undergo the matching sequence;

wherein said test equipment enables the matching sequence for one component to be suspended when the matching sequence for such one component does not succeed, while enabling the matching sequence to continue for another component.

6. Test equipment according to claim 5, wherein said enable memory (46) includes an enable output (72) which modifies the instruction that manages running of the main memory (10) when the matching sequence for matching an electronic component must be ignored.

7. Test equipment according to claim 6, further comprising decoding means (76) for receiving and decoding the instructions from said main memory (10), said decoding means being connected to said enable output (72) of the enable memory (46), an output of said decoding means managing the main memory to cause the matching sequence to be performed or to be ignored.

8. Test equipment according to claim 5, further comprising multiplexing means (68) connected to a register (66) for programming a priori the enable memory (46) and to the inputs of said enable memory for programming said enable memory in real time.

9. Test equipment according to claim 5 including a plurality of test heads, said test equipment being characterized in that said enable memory further includes a distinct output (44, 50) assigned to each of said plurality of test heads.

10. Test equipment according to claim 9, further comprising logic means (32, 34, 40) interposed between and operatively coupled to said elementary test circuits (20) and said matching circuit (54) and being connected to the outputs (44, 50) of the test heads, said logic means enabling or ignoring a matching instruction on one or more of said test heads.

11. A method of testing a plurality of electronic components in parallel comprising the steps of:

1) executing a matching sequence for each of the plurality of electronic components;

2) sequentially determining whether each of the plurality of electronic components is in a known and identical state within a predetermined time period;

3) suspending the matching sequence for each of the plurality of electronic components that is not in the known and identical state after the predetermined time period;

4) recording whether each of the plurality of electronic components is or is not in the known and identical state after the predetermined time period;

b 5) storing, in an enable memory that is addressed by the counter, enabling information corresponding to either performing the matching sequence for bringing a corresponding component into a known and identical state, or for suspending the matching sequence; and 6) writing the enabling information prior to a test sequence which corresponds to either performing the matching sequence required to place a respective component in the known and identical state in the event matching is to be enabled, or information advising that matching of the component be ignored and providing a command to proceed to a subsequent instruction.

* * * * *

UNITED STATES PATENT AND TRADEMARK OFFICE
CERTIFICATE OF CORRECTION

PATENT NO. : 6,006,346

DATED : December 21, 1999

INVENTOR(S) : Jean-Claude Fournel, et al.

It is certified that error appears in the above-identified patent and that said Letters Patent is hereby corrected as shown below:

On the title page, insert:

--[30] Foreign Application Data
23 Dec. 1994      [FR]France............................ 94 15559--.

Signed and Sealed this

Twenty-fifth Day of April, 2000

Attest:

Q. TODD DICKINSON

*Attesting Officer*      *Director of Patents and Trademarks*

UNITED STATES PATENT AND TRADEMARK OFFICE
CERTIFICATE OF CORRECTION

PATENT NO.    : 6,006,346
DATED         : December 21, 1999
INVENTOR(S)   : Fournel et al.

Page 1 of 1

It is certified that error appears in the above-identified patent and that said Letters Patent is hereby corrected as shown below:

Title page,
Insert -- Item [30] Foreign Application Priority Data
    Dec. 23, 1994  [FR]   France................94/15559 --;

Column 9,
Line 44, (claim 5, line 22), change "incrimination" to -- incrementation --;

Column 10,
Line 44, (claim 11, line 15), before "5" delete "b".

Signed and Sealed this

Thirtieth Day of October, 2001

Attest:

NICHOLAS P. GODICI
Attesting Officer    Acting Director of the United States Patent and Trademark Office